United States Patent [19]
Conner

[11] Patent Number: 5,794,175
[45] Date of Patent: Aug. 11, 1998

[54] LOW COST, HIGHLY PARALLEL MEMORY TESTER

[75] Inventor: George W. Conner, Los Gatos, Calif.

[73] Assignee: Teradyne, Inc., Boston, Mass.

[21] Appl. No.: 926,117

[22] Filed: Sep. 9, 1997

[51] Int. Cl.[6] ............................................. G06F 11/00
[52] U.S. Cl. .................. 702/119; 702/118; 395/183.01;
395/183.06; 371/22.1; 371/21.1; 324/73.1;
324/158.1
[58] Field of Search ..................... 364/580; 395/183.01,
395/183.06, 183.21, 183.22, 184.01, 551,
557; 371/22.1, 22.5, 21.1, 27.6; 324/73.1,
158.1, 754, 757, 763

[56] References Cited

U.S. PATENT DOCUMENTS

| | | | |
|---|---|---|---|
| 3,676,777 | 7/1972 | Charters | 324/754 |
| 4,293,950 | 10/1981 | Shimizu | 371/27.6 |
| 4,450,560 | 5/1984 | Conner | 371/21.1 |
| 4,585,991 | 4/1986 | Reid et al. | 324/757 |
| 4,639,919 | 1/1987 | Chang et al. | 371/27.6 |
| 4,806,852 | 2/1989 | Swan et al. | 324/73.1 |
| 5,271,796 | 12/1993 | Conner | 395/551 |
| 5,457,400 | 10/1995 | Ahmad et al. | 324/763 |
| 5,617,531 | 4/1997 | Crouch et al. | 395/183.06 |
| 5,682,472 | 10/1997 | Brehm et al. | 395/183.01 |

*Primary Examiner*—Louis M. Arana
*Assistant Examiner*—Bryan Bui
*Attorney, Agent, or Firm*—Edmund J. Walsh

[57] ABSTRACT

Automatic test equipment for semiconductor memories that provides testing of large arrays of semiconductor memory chips in parallel. Such massively parallel memory testing greatly enhances test throughput, thereby reducing cost. It greatly enhances the economics of testing memory device made according to a RAMBUS standard, which includes a low speed port and a medium speed port because it allows the same automatic test equipment to economically be used to test devices with the low speed port and the medium speed port.

17 Claims, 5 Drawing Sheets

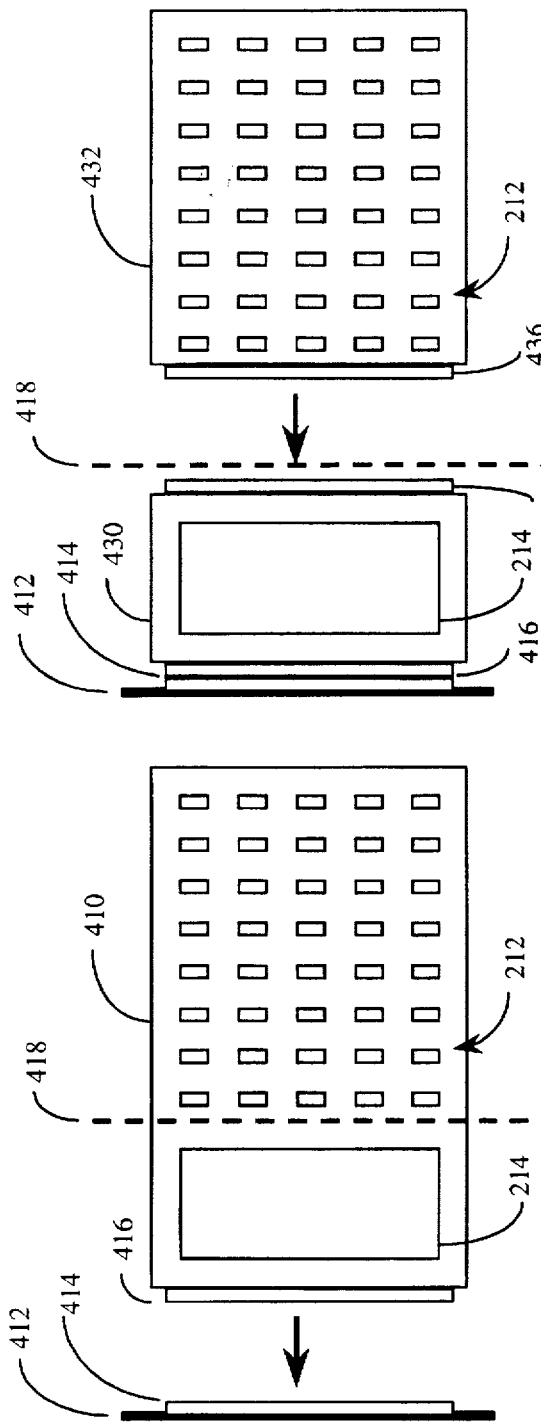
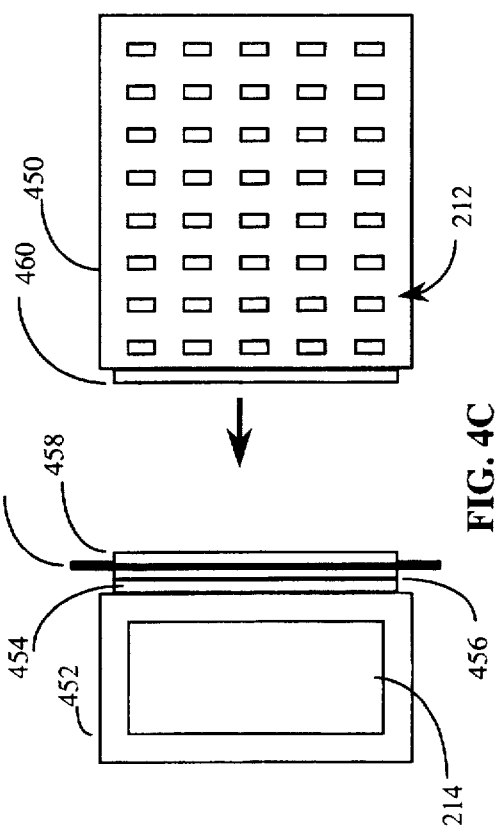

LOW COST, HIGHLY PARALLEL MEMORY TESTER

This invention relates generally to automatic test equipment for semiconductors and more specifically to automatic test equipment for testing numerous memory chips in parallel.

Semiconductor devices are made by processing a semiconductor wafer to form electronic circuitry in the semiconductor. A wafer is on the order of 20 centimeters in diameter and is large enough that numerous memory chips can be formed on one wafer.

The chips on the wafer are tested to locate defective cells. The wafer is then typically presented to a laser repair station that uses a laser to alter the electronic circuitry. Many times, it is possible to alter the electronic circuitry enough to repair defects in the memory chip.

The wafer is then cut apart into the individual chips. The chips are attached to leads and then encapsulated in a protective package. In use, the memory chip is accessed through the leads. Once packaged, the memory chip goes through a quality control process to ensure that it has been successfully manufactured.

One step of the quality control process is called "burn-in." During burn-in, numerous memory chips are inserted into sockets, or "sites", on a printed circuit board. The board is then placed in an oven where the chips are heated. Connections are made to the board and the memories are operated. Chips which are marginally operational and therefore prone to early failure are often induced to fail during burn-in.

Some limited amount of testing is done during burn-in using a burn-in tester. The burn-in tester connects to the printed circuit board used to hold the chips during burn in. The tester can generate and measure data for storage in the memory. In this way, the functionality of the memories can be tested. However, burn-in testers operate at relatively slow speeds. Current burn-in testers operate at a maximum speed of about 10 MHz. In addition, the types of things they can test for is very limited. They can not, for example, test for device timing relations or parametrics.

The test signals are generated by driver circuits and the results read from the memory are measured with a comparator. Because each site receives the same kind of memory device and each device is tested in the same way, it is possible that one driver can be used to generate test data for numerous sites simultaneously. Also, one comparator might be used to read data from multiple sites in sequence.

Following burn-in, the memory chips are generally removed from the burn in board and passed to a test stage where a more complete test is performed. Traditionally, packaged semiconductor devices have been moved around the test floor in tubes. More recently, trays have been used to transport semiconductor devices. One advantage of using trays is that multiple semiconductor devices can be presented to the test system at the same time. Pick and place mechanisms are used to move devices in and out of the trays.

Current semiconductor test systems can test multiple memories at one time. The test equipment contains multiple sites. Each site contains numerous signal lines that generate and measure the test signals for a single memory chip. The signals for each site are generated independently, and traditional memory testers have one driver/comparator circuit per signal line.

To test a memory chip, patterns of data values are written into the memory and then read back. Some tests require that there be a delay between writing into the chips and reading back from the memory. The tester verifies whether the memory adequately retains information during the period of delay. Timing relationships and parametics can be verified because each driver/comparator circuit operates to drive or measure signals at a time that can be programmed as part of specifying a test on the device. Circuitry to make calibration and deskew adjustments are generally incorporated into the tester to ensure that the test signals are actually generated at the programmed times.

State of the art memory testers contain up to 64 sites per test head, each site capable of testing a memory. However, most current memory testers have far fewer sites. Because each site is testing the same kind of chip, the test signals that are applied at each site are the same. However, to test multiple memories, the values that are read back from each memory must be processed separately.

FIG. 1 shows a prior art memory tester. The memory tester is controlled by work station 110, which might for example be a SUN SPARC® work station. The work station is connected to tester body 112, that actually generates and measures test signals. Tester body 112 is connected to test head 114 that makes contact to the memory devices under test (DUTs) 116. Each DUT 116 is connected to the tester at a site 115.

Tester body 112 contains the circuitry that generates test signals. Pattern generator 118 generates the pattern of test signals that tests each DUT 116. The test signals are passed to fan out circuit 120 that makes copies of the signals for a single DUT 116. Fan out circuit 120 makes as many copies of these signals as there are sites 115. At each site, the driver/comparators for each signal line are contained. Also, timing calibration circuitry is included for each driver/comparator at the site 115.

Each site 115 is also capable of providing responses to error processor 124. The output of each comparator at the sites 115 indicates whether the expected value occurred. Error processor 124 stores these results and can pass them on to work station 110.

During the test of a memory, pattern generator 118 and error processor 124 are under the control of control logic 122. Control logic 122 also interfaces to work station 110. Work station 110 acts as the user interface and the overall controller for the memory test. For example, work station 110 also controls a handler that presents DUTs 116 to test head 114.

To reduce the cost of test, it is desirable that there be many test sites. The overall test time decreases because test signals are applied to all the parts simultaneously. A decrease in test time can equate to a cost reduction.

However, there are practical difficulties in merely increasing the number of test sites. A primary difficulty is that of cost. Each site has a set of driver/comparators with associated timing circuitry. This circuitry is often relatively expensive so that if it is replicated for many test sites, the test system gets very costly.

A related difficulty if the number of sites is simply increased is the volume occupied by the driver/comparators and related circuitry. For accuracy reasons, this circuitry is located in a test head so that it can be physically close to the parts being tested. If the number of sites is simply increased, the test head might become unreasonably large.

In order for testing to be accurate, it is necessary that the data read back from a device under test reach the test system at a predictable time after a command to read the data is entered. Otherwise, the test system might incorrectly indicate that the expected data was not received. To ensure that the correct data is read, the traditional design approach is to equalize the propagation delays of the various data and control signals. For example, a strobe signal that causes a comparator to operate should arrive at the comparator when data from a device being read has already reached the comparator. One current way of equalizing propagation delay is through a process called "deskew." Differences in propagation delay are measured and delay elements in each signal path are adjusted until the delays through all the paths are the same.

In low speed testers, different propagation delays are not usually a problem. A low speed tester has a relatively long cycle during which each read operation is performed. A long cycle means that the data from the memory under test is available at the comparator for a long period of time. Thus, the strobe signal can reach the comparator at any point during the relatively long period of time the data is presented to the comparator. Thus, the accuracy with which the signals must be deskewed is not large. For testers that operate at speeds that are slow enough, no deskew circuitry would be required.

For testers that operate at higher speeds, much greater deskew accuracy is required because the data being read from the memories under test is presented to the comparators for a much shorter period of time. As is known, making circuitry with greater timing accuracy is more expensive. Thus, even though some low speed testers, such as burn in testers, have been built to test many parts simultaneously, there is a need for an economical tester design that can test many memories at speeds in excess of 20 MHz.

Such a need is particularly accute in the testing of memories that operate at a high data rate. In order to test the part fully, it must be tested at its intended operating speed. Memory speeds on the order of 100 MHz or higher are projected to become common place. However, higher operating speeds translate into more expensive testers.

On the other hand, full memory tests must also include retention tests, which necessarily include a delay during which the memory is left to see whether it will properly retain stored information. Because of this delay, retention tests are relatively slow tests. It is undesirable to have a high speed memory tester, which is relatively costly, perform low speed retention tests. To address this problem, some have proposed testing high speed memories, such as RamBus memories, with a "split flow." Separate low speed and high speed testers are used.

However, while split flow testing can be more economical than using a high speed tester to run low speed tests, it is still undesirable. More testers are required, which occupy floor space in a manufacturing plant, thereby increasing capital costs. Further, collateral costs of test, such as maintaining the test equipment and writing test programs are likely to be increased.

It would be highly desirable to be able to economically run retention tests and other slow tests. It would also be desirable to run higher speed tests with the same tester or the same type of tester.

SUMMARY OF THE INVENTION

With the foregoing background in mind, it is an object of the invention to provide a memory tester that can economically test multiple semiconductor chips.

The foregoing and other objects are achieved in a semiconductor test system that contains sites for multiple chips. The sites are arranged in an array with deterministic signal propagation delay differences to different sites in the array. Variable amounts of delay is introduced in certain control signals to synchronize the data and control signals.

In a preferred embodiment, the sites are disposed in a rectangular array on a printed circuit board that interfaces to a tester. Each row is driven by a common driver such that the propagation delay for each column within a row increases. Output enable signals are routed to be applied to each site in a column in one operation. The strobe signal that controls when values read from the memories are latched is selectively delayed based on which column of sites is being accessed.

BRIEF DESCRIPTION OF THE DRAWINGS

The invention will be better understood by reference to the following more detailed description and accompanying drawings in which

FIGS. 4A, 4B and 4C show alternative embodiments of a memory array board according to the invention.

DESCRIPTION OF THE PREFERRED EMBODIMENT

Figure 1:
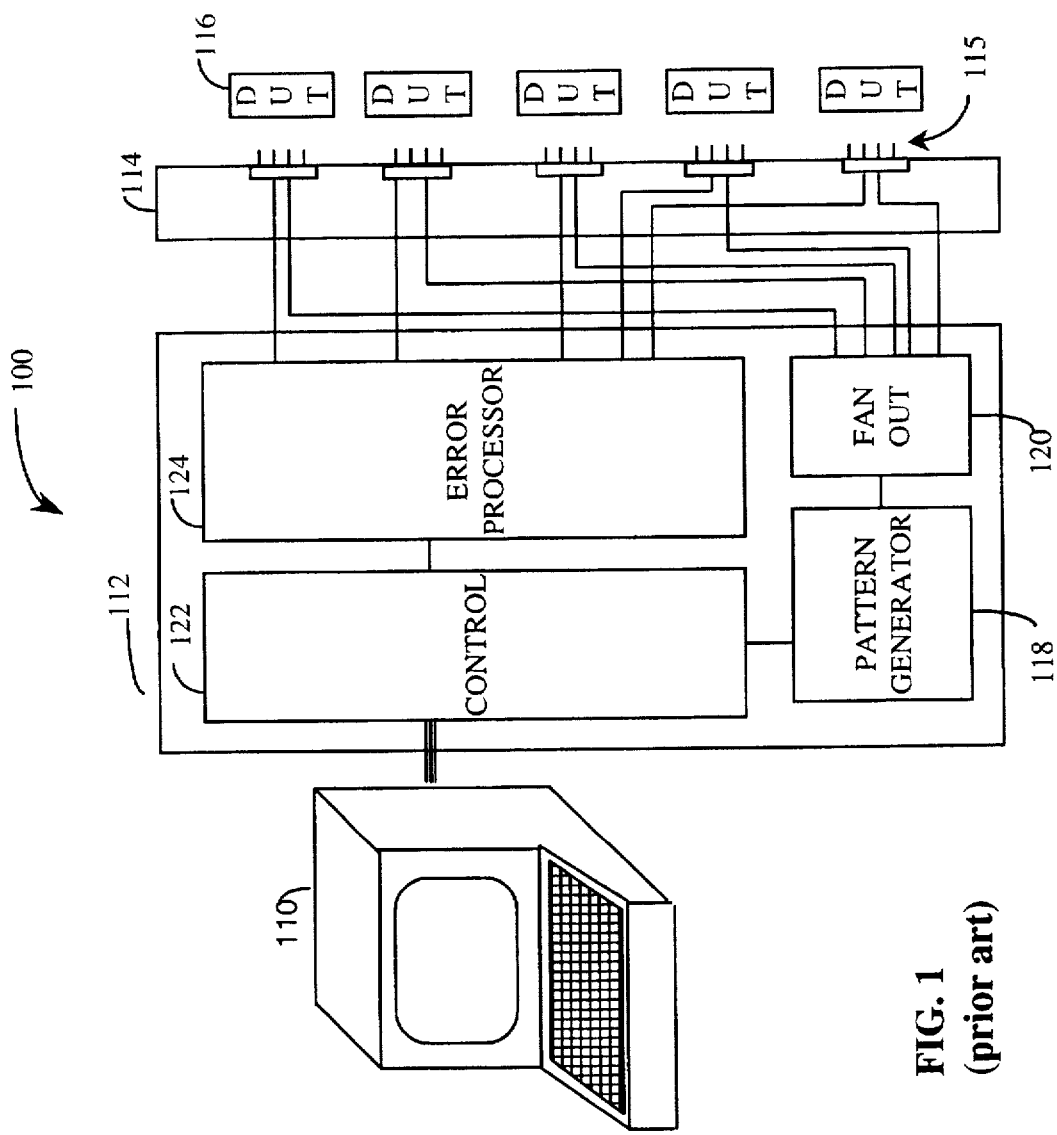
FIG. 1 is a block diagram illustration of a prior art memory tester with multiple sites.
Figure 2:
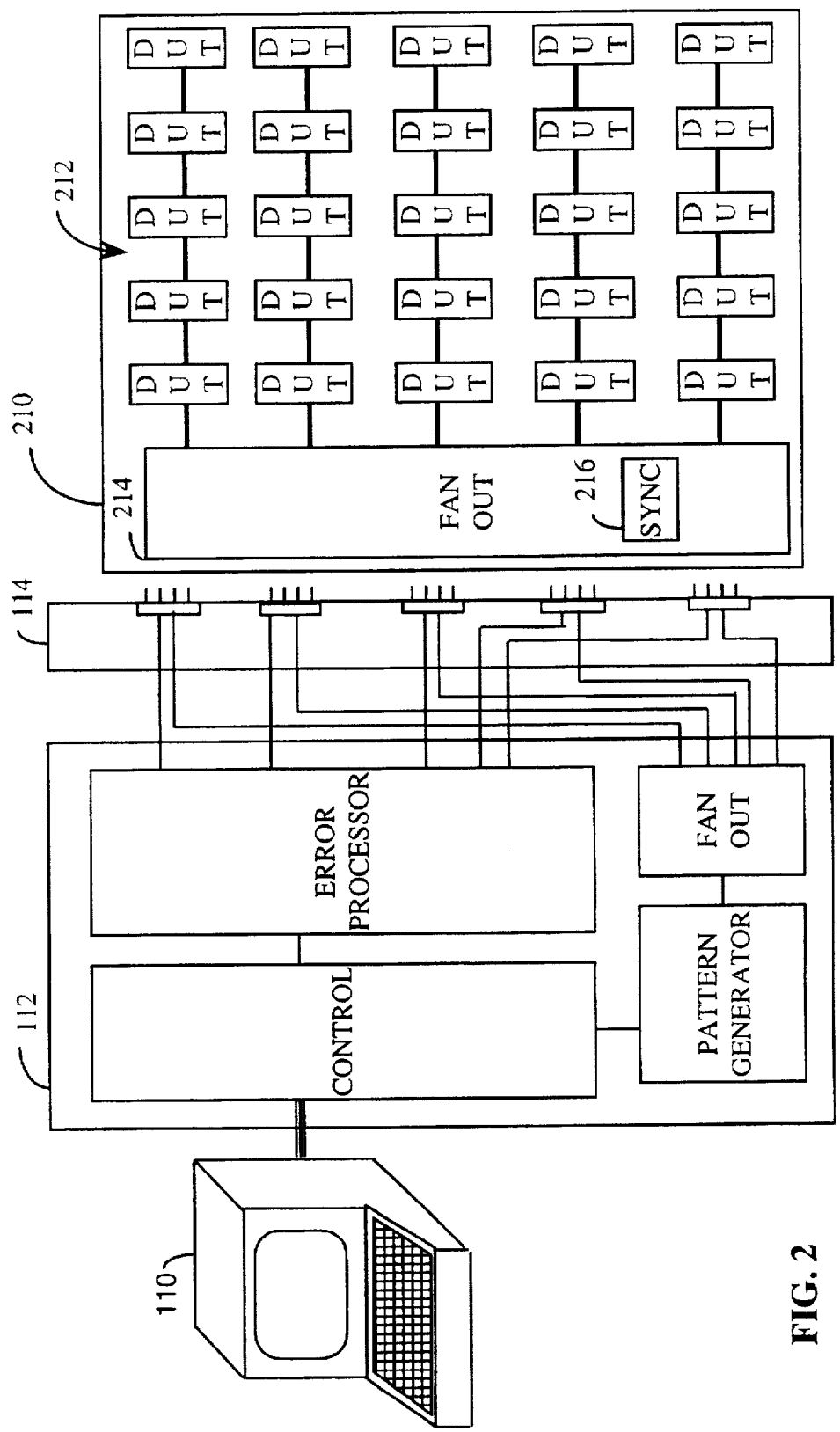
FIG. 2 is a block diagram illustrating a memory tester according to the invention with an expanded number of sites.

FIG. 2 shows a modified prior art tester 100 that can test many parts in parallel. Preferably, a memory tester is used and DUTs 116 are semiconductor memory chips. In comparison to FIG. 1, which illustrated five sites, FIG. 2 shows five rows of sites, each having five sites, for a total of 25 sites. It will be appreciated, though, that the number of sites is illustrative only and not a limitation on the invention. Preferably, there will be over 100 sites. More preferably, there will be over 500 sites. Most preferably, there will over 1,000 sites. In one embodiment, there are 64 rows of sites, each row having 16 sites, for a total of 1,024 sites.

The sites for DUTs 116 are attached to a memory array board 210. Memory array board 210 is preferably a printed circuit board of the type that would be used to fabricate a computer system or other electronic device in which memory chips might be used. Each site can be formed by attaching a socket or contactor to the printed circuit board. Signals are connected to the socket by conductive traces on the printed circuit board. Preferably, the traces will be deposited on the printed circuit board to form microstrip transmission lines, as is known in the art of printed circuit board fabrication. The layout of the traces will be described in more detail in conjunction with FIG. 3A below.

Memory array board 210 also includes fanout circuitry 214. Fanout circuitry 214 is described in greater detail below in conjunction with FIG. 3A. In general, fanout circuitry 120 provides one signal for each row in memory array 212. Fanout circuitry 214 buffers those signals to ensure each signal has sufficient power to drive a transmission line connected to every site in a row.

In addition, fanout circuitry 214 includes circuitry that controls the provision of data from the devices under test 116 to error processor 124. As part of fanout circuitry 214, synchronization circuitry 216 is included. Synchronization circuitry 216 ensures that data provided to error processor 124 comes from the appropriate ones of the devices under test 116. Operation of fanout circuitry 214 is deescribed in greater detail in conjunction with FIG. 3A below.

Memory array board 210 could be a single printed circuit board. Alternatively, it could be multiple printed circuit boards that are joined using circuit connectors or interposers. Interposers are, like circuit connectors, devices used to make connection between numerous signal lines. To use the interposer, the signal lines on each printed circuit board are brought to an array of pads. The interposer has two pads that are spaced apart by and array of springs. The pads contain features that make contact to the array of signal traces. Interposers are available from, for example, IBM or FormFactor, Inc. Alternative embodiments are shown in conjunction with FIG. 4 below.

Figure 3A:
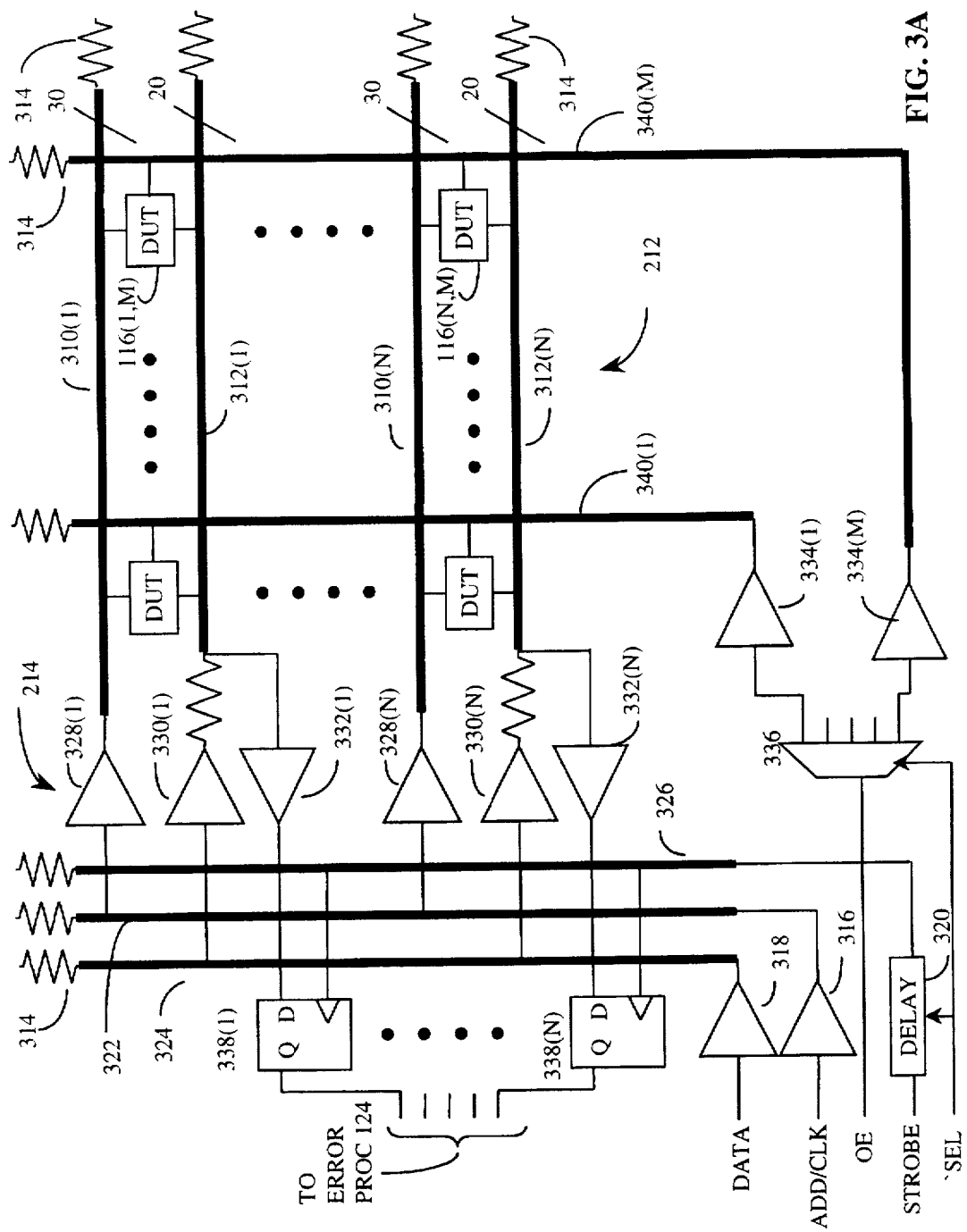
FIG. 3A shows the array of memory sites of FIG. 2 in greater detail.

Turning now to FIG. 3A, memory array board 210 is shown in greater detail. An array 212 of memory devices under test 116 is shown. Here array 212 is a rectangular array, though only selected ones of the devices under test 116 are shown. Memory array 212 is shown with N rows and M columns.

Each row of memory array 212 has a set of address lines, such as 310(1) and a set of data lines, such as 312(1). For purposes of illustration, each set of address lines has 30 lines. Each set of data lines has 20 lines. However, the number of lines in each address set is dictated by the largest memory to be tested. The number of data lines is dictated by the largest number of bits in a word in a memory under test. For purposes of illustration, one row of the array is described in detail, but each row is similarly constructed.

All of the address lines and data lines include terminations, shown schematically as termination 314. Termination 314 allows the address or data lines to act as a transmission line without reflection from the end. Sets of address lines 310(1) and data lines 312(1) are implemented as traces on a printed circuit board, according to well known circuit board design techniques.

The set of address lines for each row, such as 310(1), are each driven by a driver amplifier, shown collectively as driver 328(1). Each data line within a set of data lines 312(1) is connected to a driver/comparator pair made up of a driver 330(1) and a comparator 332(1). As above, there is one driver for each line in the set of data lines 312(1) and driver 330(1) is a schematic representation of the individual drivers connected to each of the 20 data lines in set of data lines 312(1). To prevent reflection of signals driven onto the set of data lines 312(1), each end has a termination 314, as is shown in FIG. 3A.

Each comparator 332 is a "dual comparator", meaning that it can indicate whether the result is HI or LO. A dual comparator might have multiple output lines to indicate whether the measured value is HI, LO or in some indeterminate state. However, regardless of the number of lines out of comparator 332, the architecture is as shown generally in FIG. 3A.

Address signals are provided to memory array board 210 from tester 100. Some of the individual lines at each test site 115 represent address signals. In FIG. 3A, those signals are denoted ADD/CLK. As is conventional in a semiconductor memory, those signals describe not just the address within the memory but can also include clock signals which time the operation of the memory.

An advantage of treating the address and clock signals as one group of signals is that the path length, and therefore the electrical delay, for these signals to reach any memory under test in memory array 212 is the same. Thus, the relative timing of these signals is maintained. Regardless of how long it takes the ADDR signals to reach a particular device under test, the device will be clocked to respond to that address at the appropriate time.

ADD/CLK signals are provided to buffer amplifier 316 as a group of lines. There are multiple address lines within a group. For the numerical example given herein, there are thirty separate lines. Thus, buffer amplifier 316 represents individual amplifiers on each of the lines. Preferably, these are low impedance buffer amplifiers that are matched to the physical lines that carry the signals.

Buffer amplifier 316 drives a set of address lines 322. Set of address lines 322 are implemented as traces on a printed circuit board and are laid out to provide a transmission line. Set of address lines 322 is also terminated to prevent reflection. Each of the buffer amplifiers 328(1) ... 328(N) taps off the set of address lines 322. Thus, the same address is provided to every memory under test 116(1,1) ... 116(N,M).

Data from a site 115 is driven on lines denoted DATA. The lines DATA are provided to a buffer amplifier 318, which in turn drives a set of drive data lines 324. Set of drive data lines 324 is, for the numbers used as illustration herein, twenty individual lines. Therefore, buffer amplifier 318 represents twenty individual drivers, one for each line in the set. Set of drive data lines 324 likewise represents twenty individual lines. The lines are implemented as traces on memory array board 210 that form transmission lines. As shown in FIG. 3A, the transmission lines are terminated with a termination 314. Buffer amplifiers 330(1) ... 330(N) are connected to drive data lines 324 such that each row in memory array 212 receives the same drive data.

FIG. 3A shows that the DATA lines are laid out parallel with and relatively close to ADD/CLK lines. This layout ensures that, during a write operation, the time relationship between the DATA, ADD and CLK signals is preserved so that each memory device under test stores data at the correct time.

The set of data lines for each row, such as set of data lines 312(1) can also carry data from one of the memory chips within the row of memory devices under test in array 212. The set of data lines 312(1) also has at its end a comparator 332(1). The input of buffer amplifier 312(1) is connected to the set of data lines 312(1). Buffer amplifier 312(1) actually represents one buffer amplifier for each of the data lines in the set of data lines 312(1).

The output of comparator 332(1) is connected to a data latch 338(1). Data latch 338(1) stores as many bits as there are lines in the set of data lines 312(1). When data is being read from a particular memory chip in the array of memory chip 116(1.1) ... 116(1,M) in the row, latch 338(1) is clocked to capture the information that is read. The clock input to latch 338(1) is derived from a synchronization circuit in a manner that is described in greater detail below.

Semiconductor memories have an OE, or Output Enable, signal that dictates when data is to be read from the memory. For some memory device, the output might be enabled when two or more control lines take on specific values simultaneously. However, the multiple signals could be treated as an OE signal. Thus, the OE signal is provided by the tester 100 through a site 115 when the tester reaches the part of the test at which it is going to read back test values previously stored in memory to verify correct operation of the memory.

To ensure valid data for a test, only one memory within a row must output data at a time. The OE signal can be switched such that it is distributed to only one column within array 212 at a time. In particular, the OE signal from site 115 is provided to multiplexer 336. Multiplexer 336 has as many outputs as there are columns in array 212. Each output of multiplexer 336 is connected through a buffer amplifier 334(1) ... 334(M) to a read control line 340(1) ... 340(M). Each read control line 340(1) ... 340(M) is implemented as a trace on a printed circuit board that forms a transmission line. The far end of the transmission line is therefore terminated with a termination 314.

In the illustrated embodiment, there is only one read control line per memory. Thus, read control lines 340(1).. 340(M) are single lines. However, if multiple control signals are needed to read from a memory, sets of read control lines might be used in place of the single read control lines of the illustrated embodiment.

The control input of multiplexer 336 is indicated as SEL. Testers, such as tester 112, traditionally generate multiple lines of address signals. The SEL signal can be derived from address lines that are not needed to address memories 116. In this way, control signals to read back data are provided to one column of memories under test in array 212 at a time.

As part of a read operation of the data in a column, the data read from the memories under test is latched in latches 338(1) ... 338(N). The clock signal for latches 338(1) ... 338(N), which causes them to latch data, is derived from a STROBE signal that is generated at the test site 115. However, in order for the latches 338(1) ... 338(N) to latch the correct data, it is necessary that the STROBE signal reach each of the latches 338(1) ... 338(N) at the same time that the data from the memory chip.

In designing the memory array board 210, it is necessary to consider the propagation delays of the various signals. Delay 320 corrects for propagation delays. However, as will be explained in greater detail below, the propagation delay associated with data from each device under test depends on the physical location of each device under test within memory array 212. In particular, the memory devices under test in the first column of memory array 212 are closer to the latches 338(1).. .338(N) than are the memory devices under test in the second or subsequent columns. In a likely embodiment, the physical distance between each column will translate into a difference of signal propagation times of around one half of a nanosecond.

In addition, it will take the OE signal longer to reach the memories under test in the second and subsequent columns than to reach memories in the first column of array 212. Because the memory under test does not start outputting data until the OE signal reaches it, the different propagation delays for the OE signal to reach the various memories in array 212 must also be considered. The delay of the OE signal will be of the same order as the delay in the data signal. For the example numbers given herein, when reading from a memory in memory array 212, the OE signal must be delayed by an amount that increases on the order of about 1 nanosecond for each column in memory array 212.

Thus, delay 320 delays the STROBE signal in proportion to the column which is being read. As shown in FIG. 3, the SEL signal directs the OE signal to one of the columns. Thus, the SEL signal can also be used to indicate the amount of delay that needs to be added to the STROBE signal.

It should be noted that the length of time that it takes the OE signal to reach a memory device under test depends not just on the column location of the memory, but also on the row location. For example, it takes longer for a signal to travel down control signal line 340(M) to memory device under test 116(1,M) than to memory device under test 116(N,M). However, the traces on the printed circuit board are laid out to account for this difference. In particular, the STROBE signal is delayed on line 326 an amount that is equal to the delay in control line 340(M). For this reason, a rectangular array of devices under test is preferred, with the address, data and control lines running parallel with the rows and columns of the array.

Figure 3B:
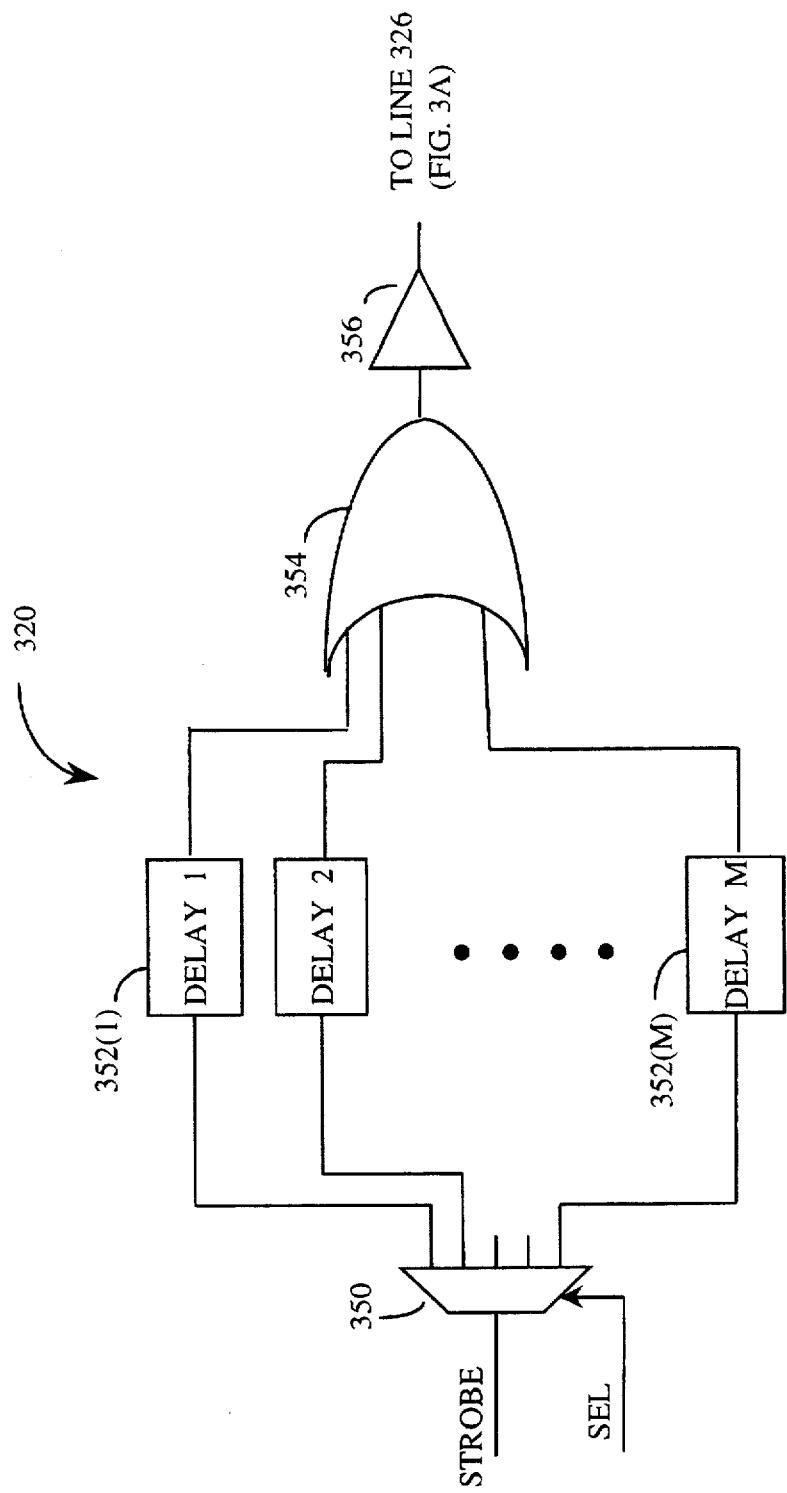
FIG. 3B shows one embodiment of the delay circuit of FIG. 3A.

FIG. 3B shows a simple implementation for delay 320. The STROBE signal is applied to the input of multiplexer 350. Multiplexer 350 has a plurality of outputs, one for each column in memory array 212. Each of the outputs is connected to a fixed delay element 352(1) ... 352(M) attached to it. The amount of delay introduced by each of the delays corresponds to the difference in time it takes the OE signal to reach a memory chip in that column plus the time for data from that memory chip to reach the latch 338(1) ... 338(N) associated with that chip and the time it takes the STROBE signal to reach that same latch, without any delay. For example, delay 352(1) might have a delay of 4 nanosecond, representing a difference in arrival time at latches 338(1) ... 338(N) of data read from memories 116(1,1) ... 116(N,M) and the STROBE signal without any delay. Delay 352(2) might have a delay of 5 nanoseconds, representing the differential delay associated with the memory devices in the first column of array 212 plus a difference of about 1 nanosecond reflecting the added delay for signal transmission between the first and second columns in array 212. Delay 352(3) would have a delay of 6 nanoseconds, representing a further 1 nanosecond delay associated with the signal propagation time between the second column and the third column.

In a preferred embodiment, the spacing between columns in array 212 would be uniform. Therefore, the remaining delays 352(4) ... 352(N) would have a delay that increases linearly, thereby "synchronizing" the data from the memory under test and the STROBE signal. In this context, though, it should be appreciated that "synchronizing" does not mean that the signals necessarily arrive simultaneously. Rather, it implies only that the signals have a desired time relationship that should, ideally, match the time relationship those signals have at site 115.

Once data from a column of memories under test in array 212 is latched in latches 338(1) ... 338(N), those values are read into tester 100. The values are stored in error processor 124. Within error processor 124, the values might be compared to expected data generated by the pattern generator and then passed on to work station 110. However, such error processing will be largely as in the prior art.

Turning to FIG. 4A, one embodiment for implementing memory array board within a tester 100 is shown. Memory array board 210 is shown implemented as a single printed circuit board 410. Memory array 212 is placed at one end of printed circuit board 410. Fan out circuitry is placed at the other end of printed circuit board 410. That end of circuit board 410 is equipped with a backplane connector 416, of the type commercially available from numerous sources.

Backplane connector 416 plugs into a mating connector 414, which is mounted to the backplane 412 of test head 114. A backplane is generally a multilayer printed circuit board with many levels of circuit traces on it so that it can carry many signals. Electrical connectors are mounted to the printed circuit board and other printed circuit boards are plugged into those connectors. The backplane provides paths to route signals between printed circuit boards. Most complex electronic systems have some form of backplane. In a traditional test system as shown in FIG. 1, the signals from tester body 112 would be distributed to circuit boards in test head 114 through a backplane in the test head. Each circuit board in the test head would, for example, have the drivers and comparators to generate and measure signals at each of the sites 115.

During memory test operations, memory chips under test are often heated for testing at an elevated temperature. It would not be desirable to heat fan out circuitry 214 every time board 410 is used to test an array of memory chips. Therefore, test head 114 is, in a preferred embodiment, equipped with a thermal baffle between the portion of circuit board 410 containing memory array 212 and the portion containing fan out circuitry 214. A thermal baffle can be implemented as an insulated wall or other heat insulating structure as known in the art.

FIG. 4B shows an alternative layout of memory array board 210. Two physically separate printed circuit boards are employed. Printed circuit board 432 contains memory array 212. Fan out circuitry 214 is contained on a separate printed circuit board 430.

Printed circuit board 430 connects to the backplane 412 through a connector 416 mounted to the printed circuit board and a mating connector mounted to backplane 412. This connection is as made in FIG. 4A. Connection between printed circuit boards 430 and 432 is made using a connector 434 mounted to printed circuit board 430 and a connector 436 mounted to printed circuit board 432. The number of signal connections between fanout circuitry 214 and memory array 212 is more than between tester body 112 and fanout circuitry 214. Thus, an interposer type connector is preferred for the connection between printed circuit boards 430 and 432. A heat baffle 418 is also shown in FIG. 4B as a way to prevent fanout circuitry from being exposed to elevated temperatures every time memory devices on printed circuit board 432 are tested at elevated temperature.

One advantage of the embodiment of FIG. 4B flows from the fact that the printed circuit board containing memory array 212 will likely need a different layout for different types of memory devices being tested. However, fanout circuitry 214 is generic circuitry that is likely to be suitable for use with almost all types of memory chips being tested. Thus, with the embodiment of FIG. 4B, when memory array board 210 are made for different types of devices, the cost for each type of device is less.

A further alternative embodiment is shown in FIG. 4C. In FIG. 4C, memory array board 210 is physically implemented as two printed circuit boards 450 and 452. Printed circuit board 452 contains memory array 212 and printed circuit board 452 contains fanout circuitry 214.

Backplane 412 has connectors on two sides. Connector 456 mates with connector 454 mounted to printed circuit board 452. Connector 458 mates with connector 460 on printed circuit board 450. In the configuration of FIG. 4C, fanout circuitry 214 is physically separated from memory array 212 by backplane 412. Therefore, a separate heat baffle is not required to prevent fanout circuitry 214 from being heated when memory array 212 is heated. However, the backplane connectors 458 and 460 are much higher density connectors 414 and 416 might be more prone to failure.

In the above described embodiment, the printed circuit boards 410, 430, 432, 452 or 450 are used only for testing an array of memory devices. However, in some manufacturing operations, memory devices are inserted into a burn-in board and operated at elevated temperature before testing. It is possible that the same board could be used for burn in and for holding memory devices for test. In that case, the memory devices would be passed directly from the burn-in stage to the test stage on the same printed circuit boards. Such an arrangement has the advantage of reducing the number of transfer steps that are required during the semiconductor manufacturing operation, which can increase throughput and reduce cost.

OPERATION

In operation, memory devices under test 116 are inserted into sockets on a memory array board 210. This step would preferably be performed by automated pick and place handling equipment. The boards would then be connected to a test head according to one of the methods shown in FIGS. 4A–4C or other equivalent contactor technology. Multiple boards would be connected at a time. Preferably, between four and sixty-four separate boards would be connected simultaneously, depending on the number of sites on each board.

In a preferred embodiment, an automated handler would move the boards from the pick and place mechanism to the test head. The automated handler would operate under the control of software running on work station 110. Alternatively, a human operator could manually insert the board into a contact point on the test head and then input a command to work station 110 to start a test.

Once a test is started, control circuitry would start the generation of data and address signals from pattern generator 118. Initially, line OE would be set to be not asserted so that none of the memory devices under test 116(1,1) . . . 116(N,M) would output data. Fanout circuitry 120 would distribute the pattern to each of the test sites 115. Each test site operates similarly.

The data and address signals would be routed to the memory devices under test through fan out circuitry 214 on each of the boards. All memory devices under test on all of the boards would have data written to them during the same write operation. Write operations would continue for all devices under test in parallel until a read operation was required.

For a read operation, a value would be read from one the chips in one column of chips at a time. For read operations, the OE line would be asserted. The SEL line would be set to a value causing multiplexer 336 to access the first column of memory array 212. The values form the first column would then be latched into latches 338(1) . . . 338(N), where they can then be transferred to error processor 124.

Once values are read from all devices in the first column of memory array 212, the value on the SEL lines would be incremented, causing muliplexer 336 to send control signals to memory devices under test 116(1,2) . . . 116(N,2) to be latched into latches 338(1) . . . 338(N). The value on the SEL lines is generated by tester 100 in accordance with a program entered by a user into work station 110. Changing the values on the SEL lines would cause delay 320 to automatically adjust for different propagation times to devices in the second column of the array.

The process would be repeated in this fashion until values from all of the memories in the array were read. Tester 100 would then process the data read back from all of the devices in the array 212. In general, the data is processed by comparing an expected value to the actual value. Within the tester, this comparison can be performed as fast as data is read from the devices under test. Therefore, tester 100 can easily process data from all of the devices under test.

Significant time reduction is possible with this method. Write time is reduced in comparison to a standard tester in proportion to number of memory devices under test in a memory array 212.

Significant savings comes from having thousands of memories programmed for a retention test at one time. The tester must wait for some delay interval as part of each test. If there are 64 sites on a tester, the tester must wait the delay interval for every 64 parts tested. However, if there are a thousand sites per tester, the tester must wait the delay interval only once for every thousand parts tested.

The invention is particularly suitable for testing RAM-BUS parts. Those parts must be tested at very slow speeds, such as for retention tests. However, RAMBUS parts are also intended to operate at very high speeds. A tester of the invention can run high speed tests. For example, it might run at 100 MHz or higher. However, its operation would still be economically viable for doing low speed testing, such as retention testing.

Having described one embodiment, numerous alternative embodiments or variations might be made. For example, the numbers of sites per tester and the number of memories in a memory array are given only for purposes of illustration. Likewise, numerical values of delay and the number of address or data lines are for illustration and not limitations on the invention.

As another example, the STROBE signal is shown being selectively delayed based on which column in the array 212 is being read. This delay is shown being introduced on the memory array board. Many automatic test systems allow the time at which a test signal is generated to be programmed. Thus, an equivalent delay might be introduced in the STROBE signal as it is generated by the tester. Generating the signal inside the tester eliminates the need for separate delay circuitry on the memory array board, which might be advantageous in some circumstances. In such case, delay 320 would represent a programmable delay inside the tester as opposed to a separate delay element on the memory array board.

The required amount of delay that is introduced by delay 320 might depend on the specific printed circuit board used or the specific type of memory chips being tested. If delay 320 represents a programmable delay inside the tester, the test program might have to be changed for different boards or different devices. In contrast, with a separate delay on each memory array board, the amount of delay introduced for each column could be calibrated by making a permanent adjustment on the board.

Also, it is not necessary that a single fixed delay 352(1) ... 352(N) be provided for each column of memory array 212. Alternative embodiments of delay 320 are also possible. For example, programmable delays are often used inside test systems. Binary weighted delay lines could be used. Alternatively, a delay can be implemented by generating a signal that increases at a known rate and comparing that signal to a programmable threshold value. An output is produced when the value of the signal crosses the threshold value. By changing the threshold value, the delay until that output signal is generated can be adjusted.

If delay 320 is programmable over a wide range of values, a memory lookup table might be used to relate each value of a SEL signal to a particular delay setting. The values in the memory lookup table would have to be measured using a calibration routine. However, because the delay required for each SEL value is stable, long times could pass between required calibrations and calibration could be performed at the factory or at a calibration laboratory instead of on a test floor. In that case, each memory lookup table might be implemented with a nonvolatile memory.

As another example of possible variation, it is not necessary that memory devices under test be inserted on a printed circuit board that is separate from the tester 100. For example, the printed circuit board might be attached to test head 114 and be configured with numerous contactors. A tray of devices might then be brought up to the contactors and the memory devices pressed into the contactors. Such an approach is sometimes used for testing trays of parts.

Also, it will be appreciated that calibration of the test system has not been explicitly described. Tester 100 might be calibrated in a conventional fashion up to the point illustrated by sites 115. This calibration would ensure that the address, data and control signals—such as OE, STROBE and SEL—have the desired time relationship at that point. Memory array board 212 might be calibrated separately. Required values for delays 352(1) ... 352(M) might be measured based on the propagation delays between columns on memory array board 212. Alternatively, memory array board might be made with the required accuracy to eliminate the need for a separate calibration of the board.

In addition, it has been described that each memory receives an Output Enable signal. This signal has been depicted as a single line. Traditional memories have been designed with an Output Enable signal being a single line. However, there is no requirement that the Output Enable signal be a single line. What is required is only that there be some mechanism for identifying which ship in an array is to output data at a specific time. For example, some memories could have an internal address register that is programmed at power up of the chip. In this way, each memory in an array would programmed with an address at power up and, during operation, certain address lines would be used to select which chip would have its output enabled. With such memories, all memories that are shown connected to the same OE line 334(1) ... 334(M) would be given the same address. This would result in all memories in the same column of array 214 outputting values at the same time such that the operation would be equivalent to what is described in conjunction with FIG. 3A. With this kind of memory, the multiplexer 336 would not be required as a separate physical element of the circuitry routing the Output Enable signal to the memories under test. Instead, the routing circuitry would be part of the tester body 112 that selected the address signals provided to the memories under test.

Also, it should be noted that the invention has not been described in relation to a particular operating speed of the tester. In a traditional tester, the operating speed can be programmed, up to a certain frequency above which the tester can not operate. However, to obtain maximum benefit from a tester according to the invention, it is intended that the maximum operating speed of tester 112 be in excess of 20 MHz. Preferably, the tester will operate at speeds of at least 50 MHz. More preferably, the speed will be above 60 MHz or even 100 MHz. With the invention, operating a massively parallel tester at such speeds becomes economically possible.

Therefore, the invention should be limited only by the spirit and scope of the appended claims.

What is claimed is:

1. Automatic test equipment for semiconductor devices comprising:
   a) an array having a plurality of sockets for memory devices under test;
   b) pattern generator circuitry having a plurality of data lines, a plurality of address lines, a strobe line and an output enable line extending therefrom;
   c) fanout circuitry comprising:
      i) a plurality of latches, each having a data input connected to a portion of the plurality of sockets for memory devices under test and a clock input;
      ii) a plurality of buffer amplifiers connecting the address and data lines to each of the plurality of sockets for memory devices under test;

iii) a programmable delay circuit connecting the strobe signal to the clock inputs of the plurality of latches, the programmable delay circuit having a control input;

iv) routing circuitry having an input connected to the output enable line and a plurality of outputs, each connected to a portion of the plurality of sockets for memory devices under test, the routing circuitry also having a control input;

v) wherein the control input of the programmable delay circuit is coupled to the control input of the routing circuit.

2. The automatic test equipment of claim 1 wherein the array comprises a rectangular array of sockets.

3. The automatic test equipment of claim 1 wherein the array is disposed on a printed circuit board external to the automatic test equipment.

4. The automatic test equipment of claim 3 wherein the array comprises at least 24 sockets.

5. The automatic test equipment of claim 4 additionally comprising at least one other like printed circuit board.

6. The automatic test equipment of claim 1 comprising at least a first printed circuit board, a second printed circuit board, and means for electrically interconnecting the first printed circuit board and the second printed circuit board, wherein the fanout circuitry is disposed on the first printed circuit board and the array is disposed on the second printed circuit board.

7. The automatic test equipment of claim 1 additionally comprising a backplane having at least two sides, with the array mounted on one side of the backplane and the fanout circuitry mounted on a second side of the backplane.

8. Automatic test equipment for semiconductor devices comprising:

a) an array having a plurality of sockets for memory devices under test;

b) pattern generator circuitry having a plurality of data lines, a plurality of address lines, a strobe line and an output enable line extending therefrom;

c) fanout circuitry comprising:

i) a plurality of latches, each having a data input connected to a portion of the plurality of sockets for memory devices under test and a latch input, causing the latch to store the data at its input when the latch input is asserted;

ii) at least one buffer amplifier, connecting the address and data lines to each of the plurality of sockets for memory devices under test;

iii) routing circuitry having an input connected to the output enable line and a plurality of outputs, each connected to a portion of the plurality of sockets for memory devices under test, the routing circuitry also having a control input;

iv) wherein the control input of the programmable delay circuit is coupled to the control input of the routing circuit;

d) a programmable delay circuit coupling the strobe signal to the latch inputs of the plurality of latches, the programmable delay circuit having a control input, with the control input to the programmable delay circuit being coupled to the control input of the routing circuit.

9. The automatic test equipment of claim 8 wherein the array comprises a rectangular array of sockets, with the sockets disposed in rows in columns, with address and data lines running parallel to the rows of sockets and the plurality of outputs of the routing circuitry run parallel with the columns of sockets.

10. The automatic test equipment of claim 8 wherein the data and address lines are implemented as microstrip transmission lines that are terminated.

11. A method of operating automatic test equipment for semiconductor devices, comprising the steps of:

a) loading a plurality of semiconductor memory devices into an array of test sites;

b) providing address and data signals to each of the semiconductor memory devices to store data into each of the semiconductor memory devices contemporaneously;

c) providing address signals to each of the semiconductor memory devices and selectively providing an output enable signal to portions of the plurality of semiconductor memory devices;

d) latching the data read from the memories with a strobe signal that has been delayed in proportion to the physical location of the portion of the plurality of memory devices that received an output enable signal; and e) processing the latched data to detect defects in the semiconductor memory devices.

12. The method of claim 11 wherein the step of loading the plurality of memory devices into an array comprises loading the memory devices into a rectangular array.

13. The method of claim 11 wherein the step of loading the plurality of memory devices into an array comprises loading the plurality of memory devices into a plurality of arrays on separate printed circuit boards and simultaneously processing the semiconductor memory devices on each of the plurality of printed circuit boards.

14. The method of claim 13 additionally comprising, prior to the step of providing address and data signals, the step of loading the semiconductor memory devices in a burn in tester.

15. The method of claim 11 wherein the semiconductor memory devices comprise RAMBUS memories.

16. The method of claim 11 additionally comprising, after the step of providing address and data signals, the step of waiting a retention interval.

17. The method of claim 16 wherein the step of providing address and data signals comprises providing address and data signals at rate that is at least 60 MHz.

* * * * *